United States Patent
Jo et al.

(10) Patent No.: US 6,727,188 B2
(45) Date of Patent: Apr. 27, 2004

(54) ETCHANT AND METHOD FOR FABRICATING A SUBSTRATE FOR AN ELECTRONIC DEVICE USING THE SAME WHEREIN THE SUBSTRATE INCLUDES A COPPER OR COPPER ALLOY FILM

(75) Inventors: Gyoo Chul Jo, Kyonggi-do (KR); Gee Sung Chae, Incheon-Kwangyokshi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/983,733

(22) Filed: Oct. 25, 2001

(65) Prior Publication Data

US 2002/0076930 A1 Jun. 20, 2002

(30) Foreign Application Priority Data

Nov. 1, 2000 (KR) .................................. P2000-64526

(51) Int. Cl.[7] ............................................. H01L 21/461
(52) U.S. Cl. ...................... 438/745; 438/749; 438/751
(58) Field of Search ................................ 438/745, 749, 438/751

(56) References Cited

U.S. PATENT DOCUMENTS

| | | | | |
|---|---|---|---|---|
| 4,734,259 A | * | 3/1988 | Frenier et al. ................. 422/16 |
| 4,785,785 A | | 11/1988 | Oba et al. .................... 123/488 |
| 5,431,776 A | * | 7/1995 | Richardson et al. ......... 216/105 |
| 5,567,224 A | * | 10/1996 | Kundrat ....................... 75/414 |
| 6,153,508 A | * | 11/2000 | Harvey ........................ 438/622 |
| 6,280,640 B1 | * | 8/2001 | Hurwitz et al. ............... 216/15 |

* cited by examiner

Primary Examiner—W. David Coleman
Assistant Examiner—William M. Brewster
(74) Attorney, Agent, or Firm—Morgan, Lewis & Bockius LLP

(57) ABSTRACT

An etchant and a method for fabricating a substrate for an electronic device using the etchant where the etchant contains a predetermined additive to control the etch rate of a Cu deposition layer (containing Cu, Cu/Ti, or Cu/Ta) over passage of time. Some examples of the additive may include a chelate having the —COOH group, a chemical compound containing a Cu ion, and a deoxidizer containing sulfur (S). The method includes forming a metal thin film containing copper (Cu) on a substrate, selectively exposing the metal thin film, and etching at least one of the exposed and the unexposed portions on the metal thin film with the additive-containing etchant to control the Cu etch rate over time against the number of sheets of processed substrates. The use of the additive-containing etchant results in improved yield and reduction in production costs because of less frequent etchant replacements.

7 Claims, 5 Drawing Sheets

ETCHANT AND METHOD FOR FABRICATING A SUBSTRATE FOR AN ELECTRONIC DEVICE USING THE SAME WHEREIN THE SUBSTRATE INCLUDES A COPPER OR COPPER ALLOY FILM

The present invention claims the benefit of Korean Patent Application No. P2000-64526 filed in Korea on Nov. 1, 2000, which is hereby incorporated by reference.

BACKGROUND OF THE INVENTION

1. Field of the Invention

The present invention generally relates to an etchant used during copper etching in a semiconductor substrate fabrication process, and more particularly, to an etchant with an additive to control change in the copper etch rate over passage of time and also to a method of fabricating a substrate for an electronic device using the additive-containing etchant.

2. Discussion of the Related Art

A substrate can be used to fabricate various electronic devices such as a thin film transistor (TFT) for a liquid crystal display (LCD) device, a solar battery, an electroluminescent display device, or a touch panel. The substrate for an electronic device includes lines and electrodes of various patterns for driving the device. A Cu deposition film, for example, Cu or Cu/Ti (Titanium) having excellent low resistance characteristics, is mainly used as a material for the above-mentioned lines and electrodes. To form desired lines and electrodes by using a material such as Cu or Cu/Ti, photolithography and etching processes must be performed on the substrate.

A related art etchant and a method for fabricating a substrate for an electronic device using that etchant is explained below with reference to FIGS. 1 and 2.

FIG. 1 is a plane view of a general TFT substrate, and FIG. 2 is a graph showing variations in etch rate against the number of sheets of processed substrates according to the related art. The TFT substrate is an example of a substrate for an electronic device, and the TFT is a constituent part of a TFT-LCD panel. As shown in FIG. 1, the TFT substrate includes gate lines 1 and data lines 2 arranged in a matrix form that divides a unit pixel; a TFT (of elements 4–7) formed on a crossing point between a gate line 1 and a data line 2; and a pixel electrode 9 electrically connected to the TFT.

As shown in FIG. 1, the TFT includes deposition films for a gate electrode 4, a semiconductor layer 5, a source electrode 6 and a drain electrode 7. The TFT serves as a switching device that turns a data signal on and off according to a scanned gate voltage applied to its gate electrode 4.

To form the patterns for gate lines, data lines and various electrodes, photolithography and etching processes must be performed on the TFT substrate. The photolithography relies on a chemical reaction in which a specific photoresist reacts chemically to light and changes its own properties. During photolithography, the desired circuit pattern is formed on the substrate using a mask and selective irradiation of light onto the substrate with the mask. Thereafter, the mask is removed and the substrate is etched to obtain the desired circuit pattern on the substrate.

Etching is a process used after photolithography to selectively eliminate the photoresist and other deposition films along patterns formed on the photoresist to obtain a real thin film circuit pattern. The etching process uses physical and chemical methods and consists of both dry-etching in which a gas is used and wet-etching in which an etchant such as acid liquid is used. It is noted that to etch a Cu deposition film of, for example, Cu or Cu/Ti, a wet-etching is preferably used.

Thus, the gate lines, the gate electrodes, the data lines, and the source and drain electrodes are finally formed with a wet-etching of a Cu deposition film using an etchant. Some examples of related art etchants include a Cu etchant containing $KHSO_5$; a Cu/Ti etchant containing HF, KF, and $KHSO_5$; or a Cu/Ta etchant.

An etching reaction of Cu is derived from hydrolysis of $KSHO_5$, that is, $KHSO_5 + H_2 => KHSO_4 + H_2O_2$. The following formulas 1 and 2 express the etching reactions of Cu.

$Cu + KHSO_5 ==> CuO + KHSO_4$  [Formula-1]

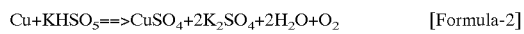

$Cu + KHSO_5 ==> CuSO_4 + 2K_2SO_4 + 2H_2O + O_2$  [Formula-2]

However, as shown in FIG. 2, when a single layer of copper (Cu) is wet-etched, the etch rate of Cu is not constant per number of sheets of processed substrates that include the single layer of Cu. The etch rate, as shown in FIG. 2 increases or decreases depending on the number of sheets of processed substrates. The increase in etch rate is caused by a reaction resulting in $CuSO_4$ that has an increased concentration as the Cu film is etched. The generated $CuSO_4$ increases the etch rate of Cu.

Table-1 given hereinbelow shows a critical dimension loss (CD-loss) of a Cu/Ti (1500 Å/300 Å) deposition film and a ΔL according to the number of sheets of processed substrates that include the Cu deposition film, where the Cu/Ti deposition film is etched by an etchant in which HF, KF, and oxone are mixed with a rate of 0.1%, 0,2%, and 2% respectively. The oxone, as used herein, is a mixture of 2 $KHSO_5$, $KHSO_4$, and $K_2SO_4$. In Table-1, the CD-loss represents a length difference between a desired pattern length and an etched pattern length that is etched more than the desired pattern length. The ΔL is a numerical value obtained by subtracting the initial CD-loss from the CD-loss of the corresponding number of sheets of processed substrates.

TABLE 1

|  | CD-loss (Å) | ΔL (Å) |
|---|---|---|
| Initial stage | 3000–3500 |  |
| Process for 450 sheets | 4600–7700 | 1600–4200 |
| Process for 800 sheets | 6400–7700 | 3400–4200 |
| Process for 1200 sheets | 5400–6100 | 2400–2600 |
| Process for 1600 sheets | 1500–1700 | 1500–1800 |
| Process for 1800 sheets | — | — |

Table-1, like FIG. 2, demonstrates that the etch rate varies as the number of sheets of processed substrates increases. This change in the etch rate over passage of time makes a uniform management of a Cu profile difficult, which causes deterioration in yield.

To obtain a uniform Cu pattern profile with a related art etchant, the etchant should be replaced after processing 450 sheets of substrates, leading to complicated processes and increased production costs due to increased etchant consumption.

Thus, a related art method of fabricating the substrate for an electronic device has the following problems. First, since it is difficult to manage a pattern profile uniformly because of the change in the etch rate over the passage of time when a deposition film of Cu or Cu/Ti is etched by a related art etchant, devices with inferior accuracy are produced.

Second, to obtain a profile of a uniform Cu pattern, the prior art etchant must be replaced periodically. Because the period for replacing an etchant becomes short, the production cost increases.

SUMMARY OF THE INVENTION

Accordingly, the present invention is directed to an etchant and a method for fabricating a substrate for an electronic device using that etchant. The etchant and the method of the present invention substantially obviate one or more problems due to limitations and disadvantages of the related art.

An object of the present invention is to provide an etchant and a method for fabricating a substrate for an electronic device using the etchant, where the etchant controls the etch rate of a Cu deposition layer (containing Cu, Cu/Ti, or Cu/Ta) over passage of time.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the etchant according to the present invention contains a predetermined additive to control the etch rate of a Cu deposition layer (containing Cu, Cu/Ti, or Cu/Ta) over passage of time. Some examples of the additive may include a chelate having the —COOH group, a chemical compound containing a Cu ion, and a deoxidizer containing sulfur (S).

In one embodiment, the method for fabricating a substrate for an electronic device includes forming a metal thin film containing copper (Cu) on a substrate, selectively exposing the metal thin film, and etching at least one of the exposed and the unexposed portions on the metal thin film with the additive-containing etchant to control the Cu etch rate over time against the number of sheets of processed substrates. The use of the additive-containing etchant according to the present invention results in the formation of the desired etch pattern.

The additive-containing etchant of the present invention improves the profile of the etched Cu, thereby improving functional accuracy and yield of an electronic device. Furthermore, since the change in an etchant over passage of time is controlled, the replacement period for the etchant is prolonged, thereby lowering production costs because of less frequent etchant replacements.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and, together with the description, serve to explain the principles of the invention. In the drawings.

DETAILED DESCRIPTION OF PREFERRED EMBODIMENTS

Reference will now be made in detail to the preferred embodiments of the present invention, examples of which are illustrated in the accompanying drawings.

As used hereinbelow, the term "TFT" includes a single TFT or an array of TFT's depending on the context of discussion. Generally, a substrate of a TFT array includes gate lines that cross data lines vertically and each TFT is arranged at a crossing point of a gate line and a data line. The substrate also includes pixel electrodes with one pixel electrode electrically connected to a corresponding TFT. Each TFT is formed by a gate electrode, a semiconductor layer, a source electrode and a drain electrode. As noted hereinabove, a TFT serves as a switching device that selectively turns a data signal on and off according to a scanned gate voltage applied to its gate electrode.

First Embodiment

FIGS. 3A to 3F are exemplary sectional drawings illustrating a method of fabricating a TFT substrate. To manufacture the TFT substrate, initially a substrate 11 is prepared and a metal thin film 13 is formed on the substrate 11 with a material including, for example, Cu (Copper), Cu/Ti (Copper/Titanium alloy), Cu/Ta (Copper/Tantalum alloy), Cu/Mo (Copper/Molybdenum alloy), or Cu/Cr (Copper/Chromium alloy).

Figure 1:
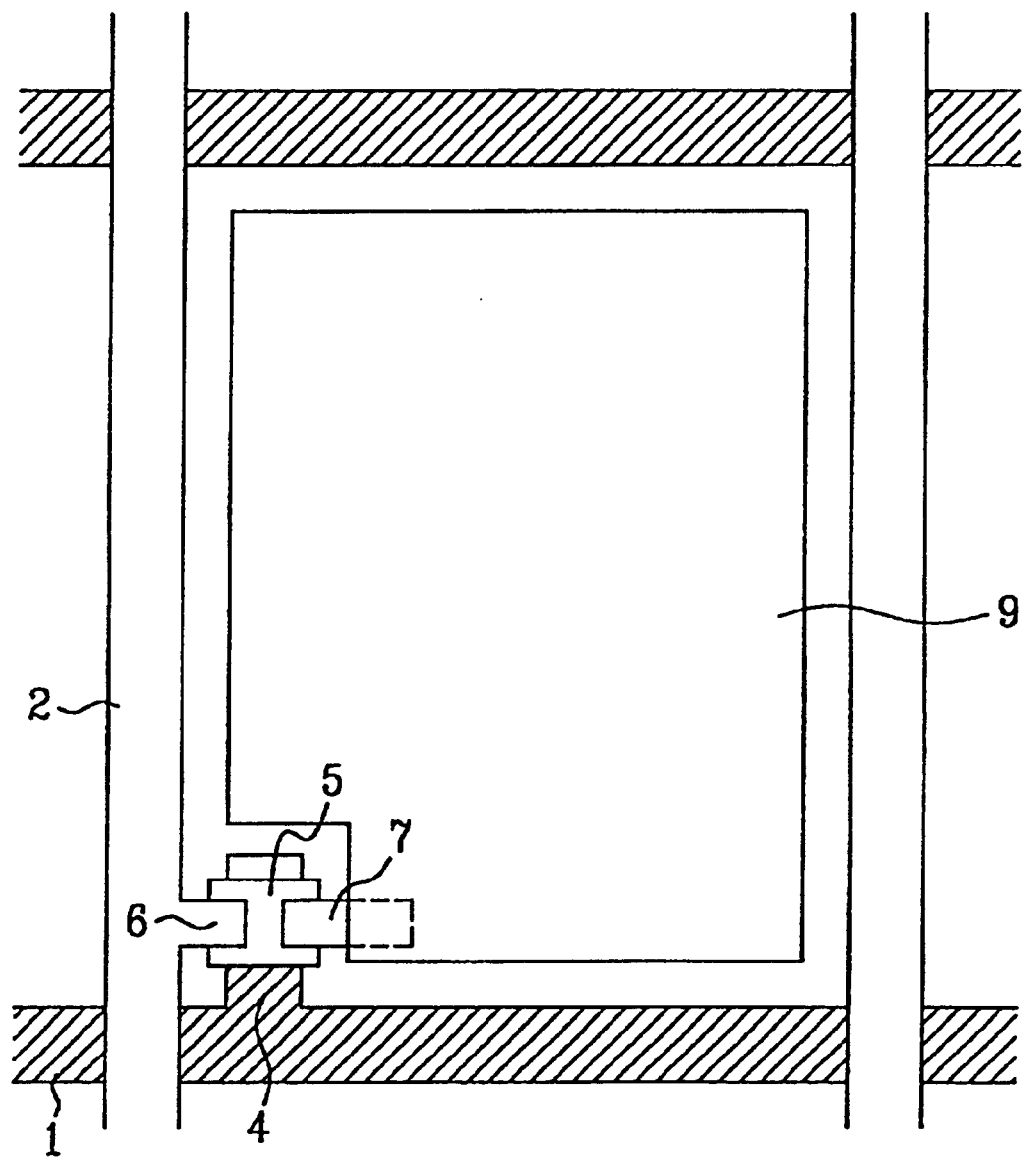
FIG. 1 illustrates a plane view of a general TFT substrate.
Figure 2:
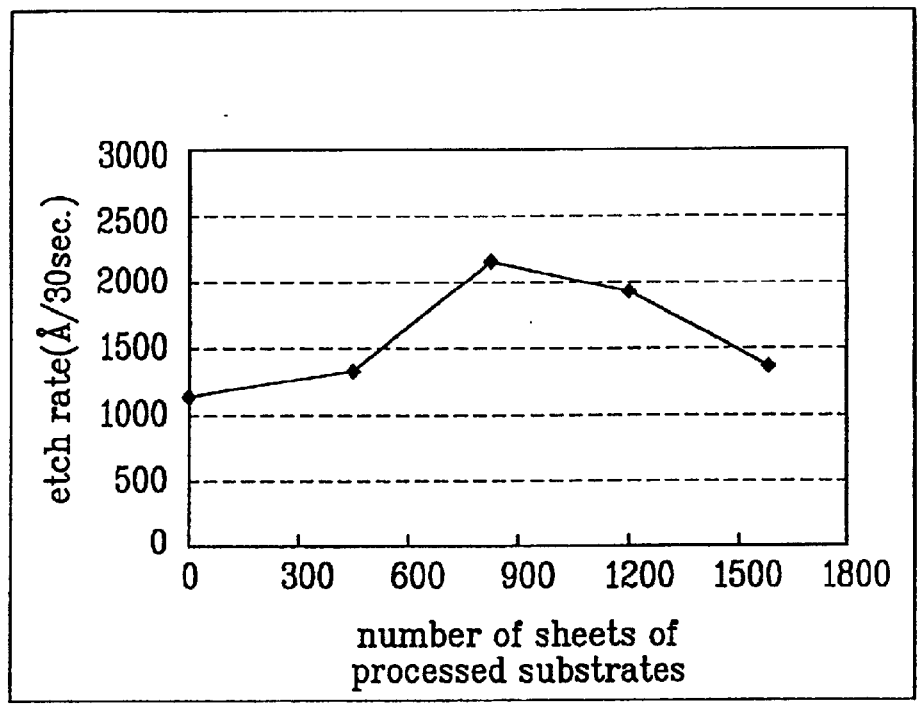
FIG. 2 is a graph showing variations in etch rate against the number of sheets of processed substrates according to the related art.
Figure 3A:
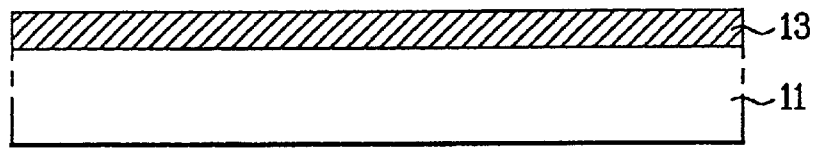
FIGS. 3A to 3F are exemplary sectional drawings illustrating a method of fabricating a TFT substrate.
Figure 3B:
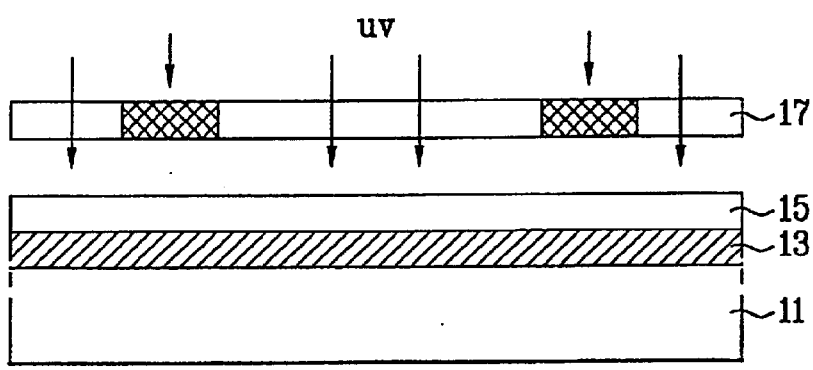
Figure 3C:
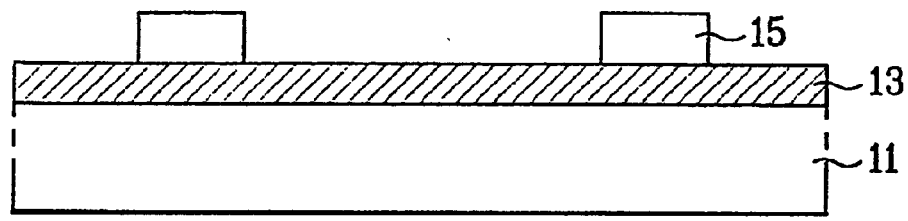

Then, as shown in FIG. 3B and FIG. 3C, a photoresist 15 is formed on the metal thin film 13 and a mask 17 is put above the photoresist 15. Light is then irradiated onto the mask 17 and the same pattern as that on the mask 17 is formed on the photoresist 15. Thereafter, the photoresist that is exposed to light is developed and eliminated by a liquid etchant. The photoresist portion not exposed to light (because of the mask 17) is eliminated and patterned according to the characteristics of the photoresist 15.

Figure 3D:
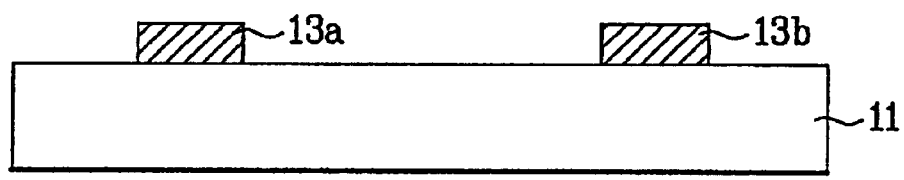

After patterning the photoresist 15, the Cu deposition film of Cu or Cu/Ti on the portion having no photoresist is wet-etched, so that a gate electrode 13a and a gate line 13b are formed as shown in FIG. 3D.

In one embodiment, the etchant of the present invention consists of an additive to control change in the Cu etch rate by the passage of time. The additive is chelate which prevents a Cu ion generated by etching from being activated in an etching reaction. Some examples of the chelate additive include $(COOH)_2$(Oxalic acid), Ethylenediaminetetraacetratic (EDTA) acid, or $(C_6H_8O_7)$. A stable etch rate can be achieved with the additive (here, chelate) in the range of 0.01% to 10% of the total volume of the etchant.

The chelate is an organic acid containing —COOH group, and prevents a Cu ion from being activated by surrounding the Cu ion as follows.

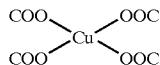

Figure 4:
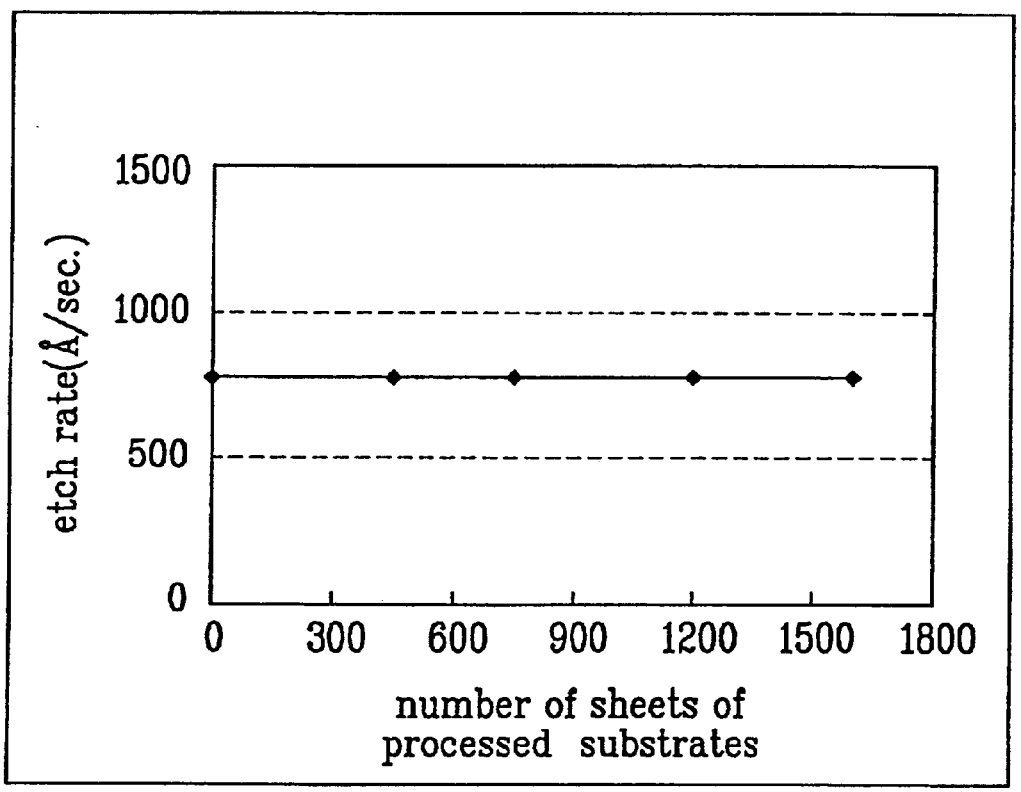
FIG. 4 illustrates a graph showing variations in etch rate according to a first embodiment of the present invention.

FIG. 4 illustrates a graph showing variations in etch rate according to a first embodiment of the present invention. The graph in FIG. 4 depicts the Cu etch rate against the number of sheets of processed substrates with a single Cu film when an etchant (e.g., chelate) having an additive (COOH)$_2$ is used. For the graph in FIG. 4, the etchant contains 0.1% of the additive. As can be seen from FIG. 4, the change in etch rate over passage of time scarcely occurs with the etchant/additive combination of the present invention.

Figure 3E:
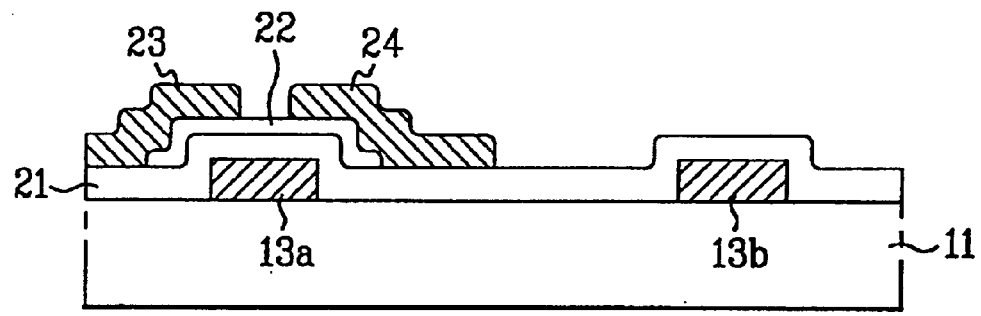

Thereafter, as shown in FIG. 3E, a gate insulating film 21 is formed on the entire surface of the substrate 11 (including the gate electrode 13a and the gate line 13b). Then, a semiconductor layer 22 is formed above the gate electrode 13a. Also, a source electrode 23 and a drain electrode 24 are formed on the semiconductor layer 22. A data line (not shown) crossing the gate line 13b is also simultaneously formed with the source and drain electrodes 23, 24.

At this time, a deposition film of the gate electrode 13a, the semiconductor layer 22, the source electrode 23 and the drain electrode 24 form a TFT.

Figure 3F:
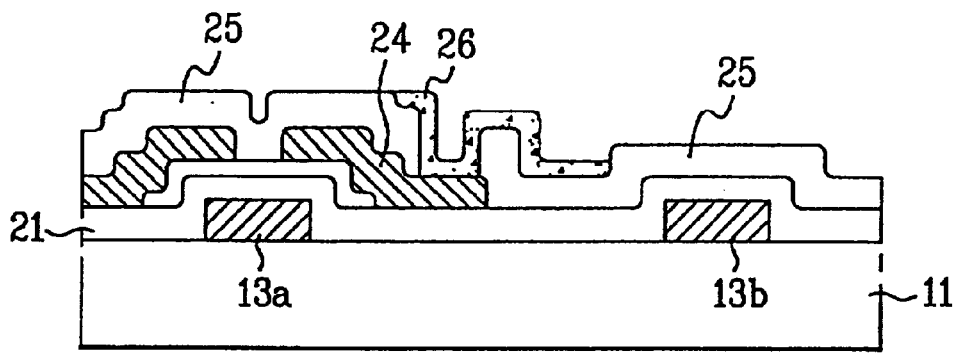

Finally, as shown in FIG. 3F, a passivation film 25 is formed on the entire surface of the substrate 11 (including the TFT). A part of the passivation film 25 is then eliminated to form a pixel electrode 26 that is connected to the drain electrode 24, thereby forming the complete TFT substrate.

Thus, in the case of forming source electrodes 23, drain electrodes 24 and data lines (not shown) from Cu, Cu/Ti or Cu/Ta, the change in the Cu etch rate over passage of time may be controlled by using an etchant having chelate (such as, for example, (COOH)$_2$(oxalic acid), (EDTA), or (C$_6$H$_8$O$_7$)) as an additive.

Second Embodiment

A TFT substrate according to a second embodiment of the present invention includes gate lines and data lines formed on a substrate; a pixel region having a matrix structure; a TFT formed at a crossing point of each gate line and data line; and a pixel electrode electrically connected to the corresponding TFT. The TFT substrate may have a gate electrode, a gate insulating film, a semiconductor layer, and a source electrode and a drain electrode deposited sequentially. The gate electrodes may be simultaneously formed with the gate lines, and the source and drain electrodes may be simultaneously formed with the data lines.

When a material such as Cu or Cu/Ti deposition film is used to form the gate lines, the gate electrodes, the source and drain electrodes, and the data lines; the Cu$^{2+}$ ion of CuSO$_4$ generated during etching is unstable. Therefore, Cu$^{2+}$ gains an electron to change into Cu$^{1+}$ as shown in the following formula-3. In other words, Cu$^{2+}$ acts as an oxidizer, which increases the number of sheets of substrates being processed over time, thereby increasing the etch rate of Cu.

$$Cu^{2+} +e- ==> Cu^{1+}$$ [Reaction formula-3]

Therefore, in the present embodiment, to prevent the etch rate of a Cu film from being increased, a Cu ion containing material such as CuSO$_4$ or CuF$_2$ is initially added to the etchant and the etchant with this additive is then used for etching.

Figure 5:
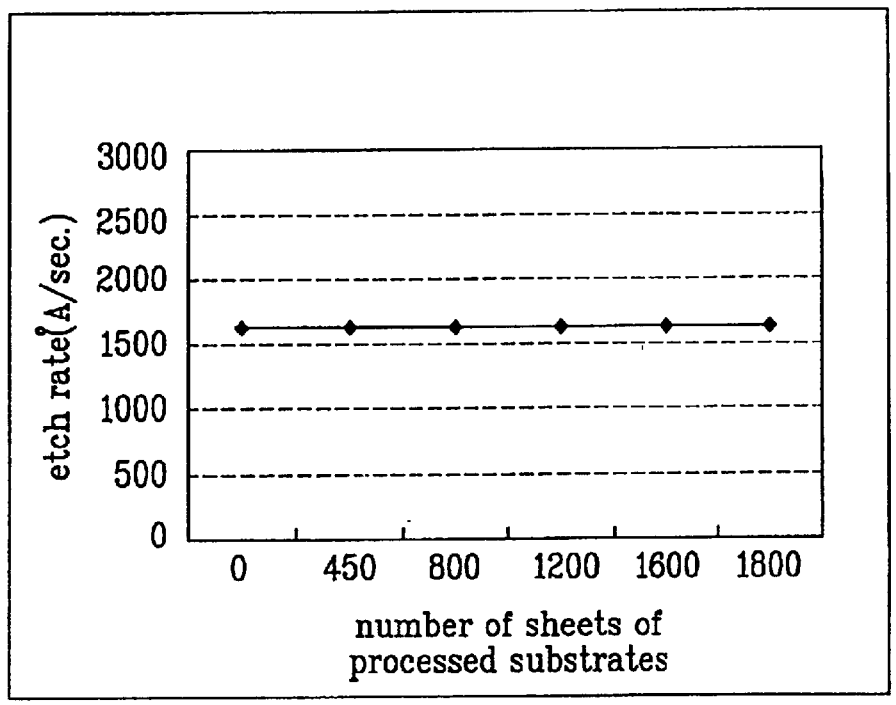
FIG. 5 illustrates a graph showing variations in etch rate according to a second embodiment of the present invention.

FIG. 5 illustrates a graph showing variations in etch rate according to this second embodiment of the present invention. The graph in FIG. 5 depicts the Cu etch rate against the number of sheets of processed substrates with a single Cu film when an etchant with a Cu ion containing material is used. For the graph in FIG. 5, the etchant contains 0.1% of CuSO$_4$ added to 2% of oxone. As can be seen from FIG. 5, the change in etch rate over passage of time scarcely occurs with the etchant/additive combination of the present invention.

Third Embodiment

A TFT substrate according to a third embodiment of the present invention includes gate lines crossing data lines and having a plurality of pixel regions on a substrate having insulating characteristics. The TFT substrate also includes a TFT formed at a crossing point of each gate line and data line; and a pixel electrode formed so as to electrically connect to the corresponding TFT. The TFT substrate may have a gate electrode, a gate insulating film, a semiconductor layer, and a source electrode and a drain electrode deposited sequentially. The gate electrodes may be simultaneously formed with the gate lines, and the source and drain electrodes may be simultaneously formed with the data lines.

When a material such as Cu, Cu/Ta or Cu/Ti deposition film is used to form the gate lines, the gate electrodes, the source and drain electrodes, and the data lines; the Cu$^{2+}$ ion of CuSO$_4$ generated by a chemical reaction between a Cu film and an etchant during the etching process is unstable. Therefore, the Cu$_{2+}$ ion is deoxidized into Cu as shown in formula-3 given hereinabove. In other words, Cu$^{2+}$ acts as an oxidizer, which increases the number of sheets of substrates being processed over time, thereby increasing the etch rate of Cu.

Therefore, in the present embodiment, a deoxidizer containing sulfur (S) such as, for example, disulfate, thiosulfate, or dithionate, is added to the related art etchant for etching Cu or Cu/Ti to prevent the etch rate of a Cu film from being increased. In other words, a deoxidizer is added to Cu$^{2+}$, thereby diminishing its (Cu$^{2+}$'s) role as an oxidizer.

The deoxidizer may include, for example, a disulfate expressed as a chemical formula of M$_x$SO$_3$ or MHSO$_3$; a thiosulfate expressed as a chemical formula of M'$_x$S$_2$O$_3$; and a dithionate expressed as a chemical formula of M"$_x$S$_2$O$_4$. Here, the "$_x$" is an integer in the range of 1 through 4, and the M is one of K (Potassium), NH$_4$, Na (Sodium), Ca (Calcium), Ba (Barium), Cd (Cadmium), Fe (Iron), Pb (Lead), Ag (Silver), Sr (Strontium), and Ti (Titanium). The M' is one of K, NH$_4$, Na, Ca, Li (Lithium), Mn (Manganese), Sr, Fe, Mg (Magnesium), Co (Cobalt), and Ni (Nickel). And, the M" is one of K, NH$_4$, Na, Ca, and Zn (Zinc).

Figure 6:
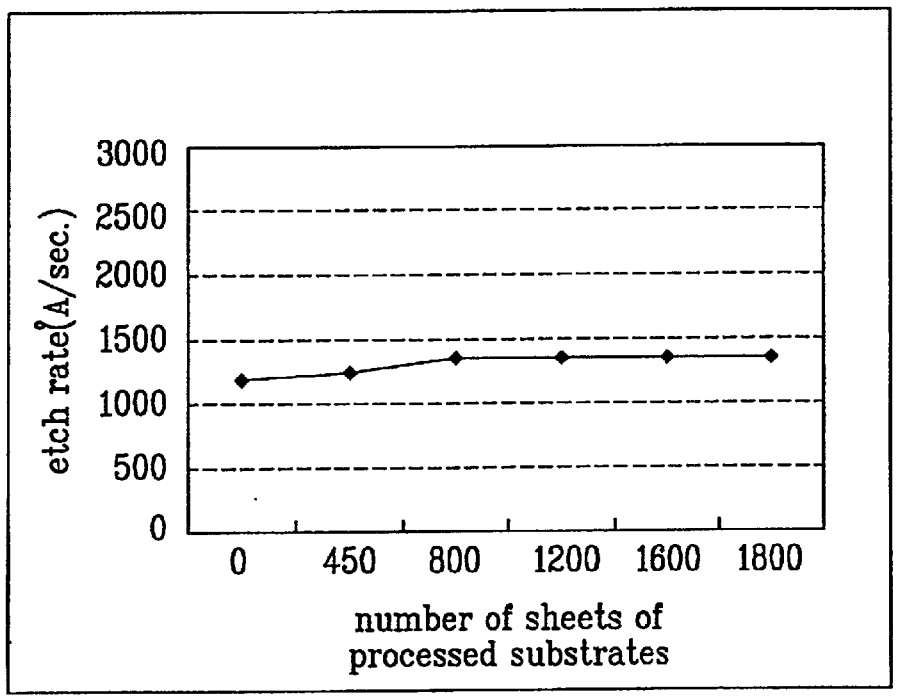
FIG. 6 illustrates a graph showing variations in etch rate according to a third embodiment of the present invention.

FIG. 6 illustrates a graph showing variations in etch rate according to this third embodiment of the present invention. The graph in FIG. 6 depicts the Cu etch rate against the number of sheets of processed substrates with a single Cu film when an etchant with a deoxidizer is used. For the graph in FIG. 6, the etchant contains 0.2% of K$_2$SO$_3$ added to 2% of oxone. As can be seen from FIG. 6, the etch rate remains relatively unchanged over passage of time with the etchant/additive combination of the present invention.

The etchant (with an additive) and a method for fabricating a substrate for an electronic device using the additive-containing etchant according to the present invention have the following advantages. First, an unstable Cu etch rate as given by the increase in the number of sheets of processed substrates can be controlled by adding a predetermined additive to the prior art etchant as discussed hereinabove. The additive-containing etchant of the present invention prevents changes in the etch rate of a Cu single film or a Cu deposition film (such as Cu/Ti and Cu/Ta) over passage of time. Therefore, the profile of the etched Cu is improved, thereby improving functional accuracy and yield of an electronic device. Second, since the change in an etchant over passage of time is controlled, the replacement period for the etchant is prolonged, thereby lowering production costs because of less frequent etchant replacements.

The foregoing embodiments are merely exemplary and are not to be construed as limiting the present invention. It will be apparent to those skilled in the art that various modifications and variations can be made in the etchant according to the present invention and the method of substrate fabrication using the etchant of the present invention without departing from the spirit or scope of the invention. Thus, it is intended that the present invention cover the modifications and variations of this invention provided they come within the scope of the appended claims and their equivalents.

What is claimed is:

1. An etchant to control an etching rate of a metal film including one of a copper (Cu) film and a copper alloy film, the etchant comprising:
    a first portion containing at least one of the following:
        an HF solution at a first percentage of the etchant,
        a KF solution at a second percentage of the etchant, and
        an oxone at a third percentage of the etchant; and
    a second portion containing one of the following additives:
        a chelate that includes the —COOH group including at least one of $(COOH)_2$ (Oxylic Acid) and $C_6H_8O_7$, $CuF_2$, and
        a deoxidizer containing sulfur (S) including at least one of a disulfate, a thiosulfate excluding $(NH_4)_2S_2O_3$, and a dithionate.

2. The etchant of claim 1, wherein the first portion contains the HF solution at the first percentage of about 0.1%, the KF solution at the second percentage of about 0.2%, and the oxone at the third percentage of about 2%.

3. The etchant of claim 2, wherein the oxone includes at least one of $2KHSO_5$; $KHSO_4$; and $K_2SO_4$.

4. The etchant of claim 1, wherein the proportion of the chelate within the etchant is in the range of about 0.01% to about 10%.

5. The etchant of claim 1, wherein the disulfate is a compound expressed as a chemical formula $M_xSO_3$ or $MHSO_3$, where "$x$" is an integer in the range of 1 through 4, and M includes at least one of K, $NH_4$, Na, Ca, Ba, Cd, Fe, Pb, Ag, Sr, and Ti, wherein the thiosulfate is a compound expressed as a chemical formula $M'_xS_2O_3$, where "$x$" is an integer in the range of 1 through 4, and M' includes at least one of K, Ca, Li, Mn, Sr, Fe, Mg, Co, and Ni, wherein the dithionate is a compound expressed as a chemical formula $M''_xS_2O_4$, where "$x$" is an integer in the range of 1 through 4, and M'' includes at least one of K, $NH_4$, Na, Ca, and Zn.

6. A method of fabricating a substrate for an electronic device comprising:
    forming a metal thin film containing copper (Cu) on the substrate, wherein the metal thin film is one of the following: a film of copper, and a film of copper alloy including one of a Cu/Ti alloy, a Cu/Ta alloy, a Cu/Mo alloy and a Cu/Cr alloy;
    selectively exposing the metal thin film, thereby creating an exposed portion and an unexposed portion on the metal thin film; and
    etching at least one of the exposed and the unexposed portions on the metal thin film with an etchant comprising:
        a first portion containing at least one of the following:
            an HF solution at a first percentage of the etchant,
            a KF solution at a second percentage of the etchant, and
            an oxone at a third percentage of the etchant; and
        a second portion containing one of the following:
            a chelate that includes the —COOH group including at least one of $(COOH)_2$ (Oxylic Acid) and $C_6H_8O_7$, $CuF_2$, and
            a deoxidizer containing sulfur (S) including at least one of a disulfate, a thiosulfate excluding $(NH_4)_2S_2O_3$, and a dithionate.

7. The etchant of claim 6, wherein the disulfate is a compound expressed as a chemical formula $M_xSO_3$ or $MHSO_3$, where "$x$" is an integer in the range of 1 through 4, and M includes at least one of K, $NH_4$, Na, Ca, Ba, Cd, Fe, Pb, Ag, Sr, and Ti, wherein the thiosulfate is a compound expressed as a chemical formula $M'_xS_2O_3$, where "$x$" is an integer in the range of 1 through 4, and M' includes at least one of K, Ca, Li, Mn, Sr, Fe, Mg, Co, and Ni, wherein the dithionate is a compound expressed as a chemical formula $M''_xS_2O_4$, where "$x$" is an integer in the range of 1 through 4, and M'' includes at least one of K, $NH_4$, Na, Ca, and Zn.

* * * * *